United States Patent [19]

Jambotkar

[11] 4,264,857
[45] Apr. 28, 1981

[54] CONSTANT VOLTAGE THRESHOLD DEVICE

[75] Inventor: Chakrapani G. Jambotkar, Hopewell Junction, N.Y.

[73] Assignee: International Business Machines Corporation, Armonk, N.Y.

[21] Appl. No.: 920,920

[22] Filed: Jun. 30, 1978

[51] Int. Cl.³ .................. H01L 27/04; G05F 1/613
[52] U.S. Cl. .................. 323/226; 323/311; 307/297; 307/304; 357/22; 357/42
[58] Field of Search .................. 357/13, 22, 23, 41, 357/42; 307/237, 297, 304; 323/22 R, 8

[56] References Cited

U.S. PATENT DOCUMENTS

| | | | |
|---|---|---|---|
| 3,512,058 | 5/1970 | Khajezadeh et al. | 357/13 |
| 3,619,740 | 11/1971 | Nakanuma et al. | 357/22 |
| 3,639,813 | 2/1972 | Kamoshida et al. | 357/22 |
| 3,764,864 | 10/1973 | Okumura et al. | 357/13 |
| 4,033,797 | 7/1977 | Dill et al. | 357/42 |
| 4,053,916 | 10/1977 | Cricchi et al. | 357/23 |
| 4,066,917 | 1/1978 | Compton et al. | 357/22 |
| 4,131,908 | 12/1978 | Daub et al. | 357/42 |

OTHER PUBLICATIONS

National Semiconductor CMOS Databook (National, 1977) pp. 2–27.
RCA COS/MOS Integrated Circuits Manual, #CMS-270, (RCA, 1971), pp. 25 and 51.
Asai et al., 1976 IEEE IEDM Tech. Digest, pp. 185–187, (Dec. 1976), "Back–Gate Input MOS . . . ".

*Primary Examiner*—William D. Larkins
*Attorney, Agent, or Firm*—Theodore E. Galanthay

[57] ABSTRACT

Disclosed is a constant voltage threshold device for providing a substantially constant voltage across a pair of terminals. The threshold device includes a field effect device having source and drain regions formed into an isolated semiconductor region which, in turn, is formed into a substrate. The distance between the drain region of the field effect device and the substrate is directly related to the threshold voltage of the threshold device. The threshold voltage is also determined by the relative doping levels of the various semiconductor regions and the value of various fixed biasing potentials applied to the various electrodes of the threshold device.

9 Claims, 14 Drawing Figures

CONSTANT VOLTAGE THRESHOLD DEVICE

DESCRIPTION

1. Technical Field

This invention relates to a constant voltage threshold device for providing a substantially constant voltage across a pair of terminals and having various useful applications as a reference voltage generator, threshold detector or the like.

One object of the present invention is to provide a constant voltage threshold device fabricatable to a fixed threshold voltage over a very wide range.

Another object of the present invention is to provide such a threshold voltage device having a threshold controllable by the application of a fixed potential.

Lastly, it is an object of this invention to provide a threshold device with a large current carrying capability.

2. Background Art

In the prior art, there are a number of known semiconductor devices such as zener diodes which are fabricated for the purpose of providing a stable reference voltage. Such zener diodes have a predetermined threshold voltage such that an applied potential that exceeds the threshold potential will be clamped to that threshold potential by means of current conducted by the zener diode. Although zener diodes with various threshold voltage levels are fabricatable, the range of such available threshold voltages is quite small. Also, zener diodes do not lend themselves to convenient fabrication in integrated circuit technology. Lastly, the current carrying capability of zener diodes is limited.

BRIEF DESCRIPTION OF THE DRAWINGS

In the accompanying drawings forming a material part of this disclosure:

FIG. 2C is a top view of which FIGS. 2A and 2B are cross sections.

DISCLOSURE OF INVENTION

For further comprehension of my invention and the objects and advantages thereof, reference will be made to the following description and accompanying drawings and to the appended claims in which the various novel features of the invention are more particularly set forth herein.

Figure 1:
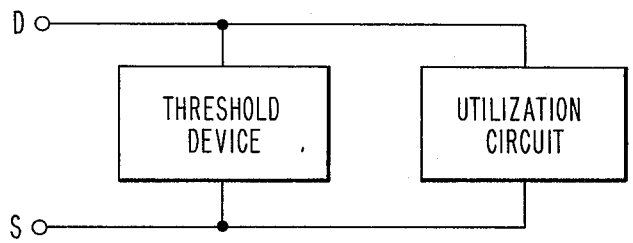
FIG. 1 schematically illustrates the advantageous utilization of a threshold device in accordance with my invention.

As seen in FIG. 1, there is illustrated a threshold device connected in parallel with a utilization circuit. A power supply, or the like, supplies a potential difference across terminals D and S. When the supply potential attempts to exceed the threshold voltage of the threshold device, the voltage across terminals D and S is clamped. Thus, as the voltage provided by the power supply attempts to increase beyond the threshold voltage, the utilization circuit will only see the fixed voltage that has been preset as the threshold voltage of the threshold device.

Figure 2A:
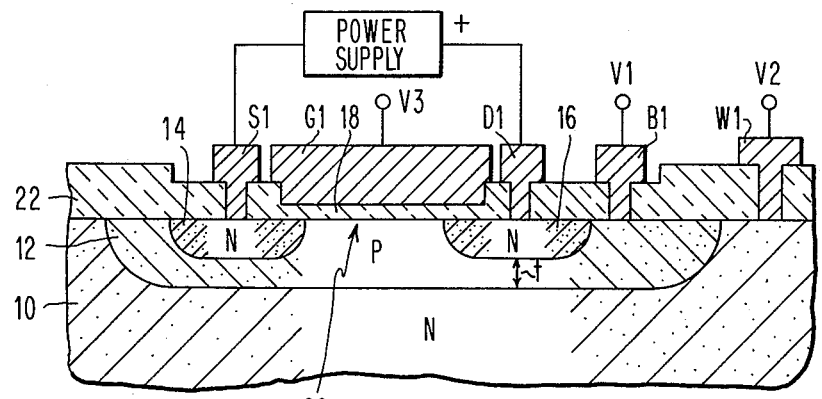
FIG. 2A is a cross sectional view of one embodiment of my invention.

Referring now to FIG. 2A there is illustrated a cross sectional view of a semiconductor structure in accordance with my invention. Into an N type substrate 10 there is formed a P type doped region 12 either by diffusion or ion implantation. Subsequently N type regions 14 and 16 are formed into P type region 12, also either by diffusion or ion implantation. For the purposes of this example, assume that region 14 will be used as a source region while region 16 will be used as a drain region of a field effect device. The doping concentration and depth of region 16 can be controlled so that the distance t between regions 16 and 10 can be controlled very accurately. The closest distance anywhere between regions 10 and 16 significantly affects threshold voltage so that the distance t' (FIG. 2B) is also critical. The accurate control of t and t' provides the accurate setting of a wide range of threshold voltages.

The region between regions 14 and 16 is covered by a thin silicon dioxide layer 18 commonly referred to as gate oxide. The region underneath the gate oxide comprises surface portions of region 12 and forms the channel 20 between source region 14 and drain region 16. Overlying gate oxide 18 and channel 20 is gate electrode G1 which may be formed from either metal or doped polysilicon by well known semiconductor processes. Also, electrode S1 makes contact to source 14, electrode D1 makes contact to drain region 16, electrode B1 makes contact to region 12, while electrode W1 makes contact to substrate 10.

Means are provided for applying various potential levels to the illustrated electrodes. Terminals V1, V2 and V3 provide desired fixed voltages to each of the respective electrodes B1, W1, and G1. The voltage source or power supply which will have its output potential controlled is connected across terminals D1 and S1. (The utilization device would, of course, be in electrical parallel with the power supply and terminals S1 and D1). As illustrated, the more positive potential would be applied to terminal D1.

Figure 2B:
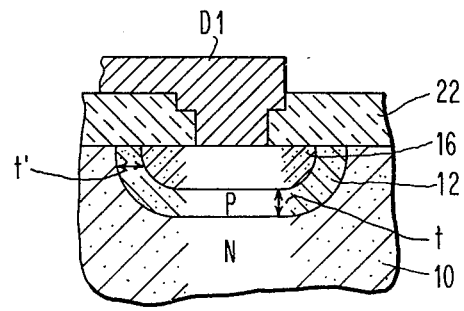
FIG. 2B is another cross sectional view of the FIG. 2A embodiment.

Refer now to FIG. 2B which is another cross sectional view of the semiconductor structure of FIG. 2A. Corresponding reference numerals have been utilized. It is clearly shown how isolated semiconductor region 12 is completely surrounded by substrate 10. Also illustrated is the N type drain region 16 and the drain contact D1. Insulating regions 22 are formed by the conventional surface oxide through which the various contact holes are made so that, for example, electrode D1 can contact drain region 16. It is also known that the interface between an electrode such as D1 and semiconductor region 16 requires a relatively highly doped semiconductor region in order to form an ohmic contact. Otherwise, a Schottky barrier diode would be formed. In the illustrated drawings, the doping level of the various N regions is sufficiently high (impurity concentrations are at least $10^{19}$/cc) in order to ensure ohmic contacts.

Figure 2C:
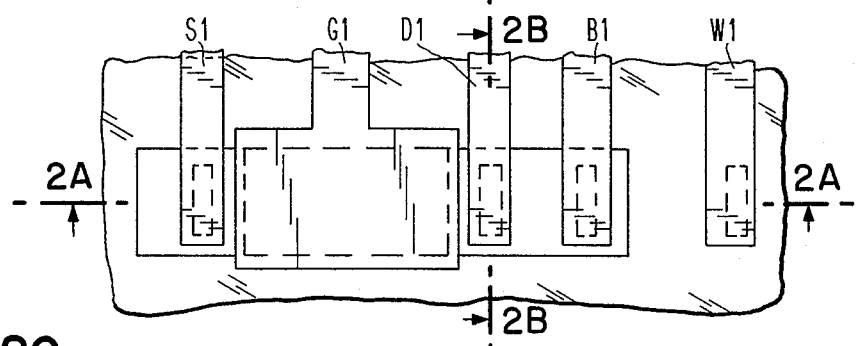

Refer now to FIG. 2C which is a top view of the structure shown in cross section in FIGS. 2A and 2B. The various electrodes are specifically designated together with the cross section lines. Thus, while FIG. 2A is a cross section across section line 2A, FIG. 2B is a cross section across section line 2B perpendicular thereto and across the drain electrode D1.

Figure 3:
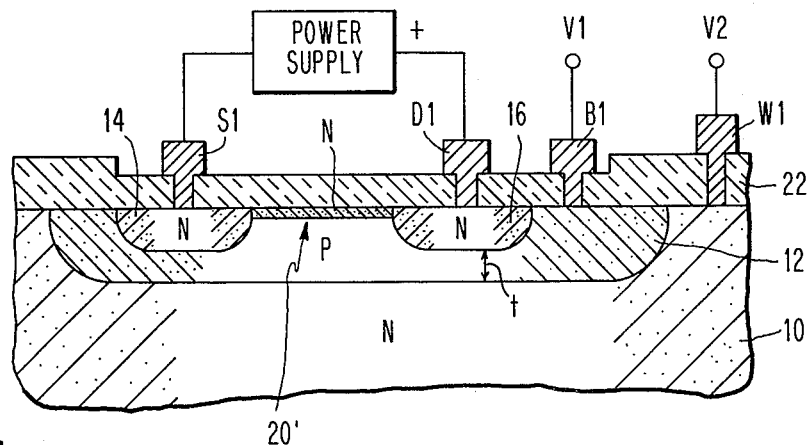
FIG. 3 is a schematic cross sectional illustration of another embodiment of my invention.

Refer now to FIG. 3 which is a cross sectional view of an alternate embodiment of the present invention. Items corresponding to the FIG. 2A embodiment have been identified with corresponding reference numerals. A significant difference between the FIG. 3 and the FIG. 2A embodiments is that FIG. 3 illustrates a depletion mode device where an N type dopant layer is implanted into the channel region forming channel region 20'. This eliminates the need for a gate electrode and gate oxide. Thus, the gate oxide is replaced by the same oxide 22 covering the remainder of the device. Since no gate electrode is needed or provided, a fixed potential V3 is also not required in this embodiment.

Figure 4A:
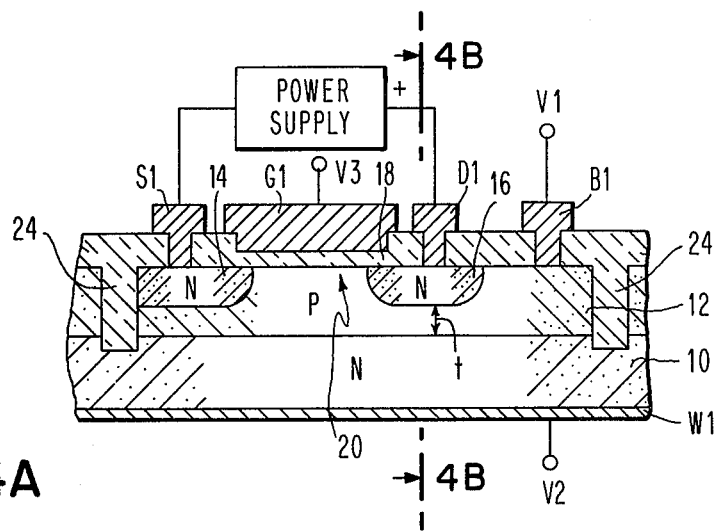
FIGS. 4A and 4B are schematic cross sectional illustrations of a still further embodiment of my invention.

Refer now to FIG. 4A for a still further embodiment of my invention. Reference numerals corresponding to those of the FIG. 2A embodiment have again been used to designate corresponding elements insofar as is practical. Although the FIG. 2A embodiment which has the gate electrode G1 and gate oxide 18 have been used as a reference for the description of this FIG. 4A embodiment, the implanted channel embodiment illustrated in FIG. 3 is similarly applicable. The significant distinction of the FIG. 4A embodiment over those previously described is the isolation provided by recessed oxide region 24 which surrounds isolated semiconductor region 12. Recessed oxide sidewall isolation is well known in the art. It is formed by etching a trench into region 12 and then converting remaining portions of the material of region 12 into oxide, in situ, to form the illustrated oxide 24. Oxide 24 is intended to penetrate the P-N junction formed by region 12 and substrate 10 in order to isolate P region 12 from other similar P regions. As also noted in the FIG. 4A embodiment, contact to substrate 10 is conveniently made by electrode W1 to the backside of the semiconductor wafer or chip.

Figure 4B:
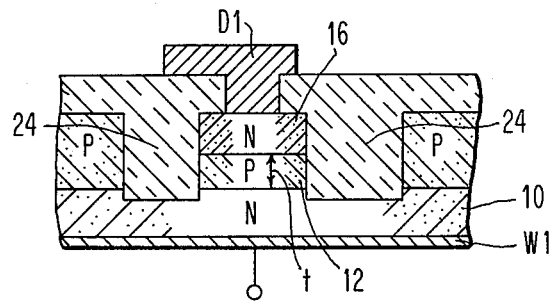

The cross sectional view of FIG. 4B is along section line BB of FIG. 4A and is intended primarily to illustrate how the recessed oxide 24 completely surrounds not only the region 12 but also drain region 16. This provides complete isolation from other portions of the P type layer covering the N type substrate 10. Also note that the recessed oxide 24 forms a continuous oxide layer with the conventional oxide covering the semiconductor device into which the contact holes for electrodes such as D1 are formed.

Figure 5:
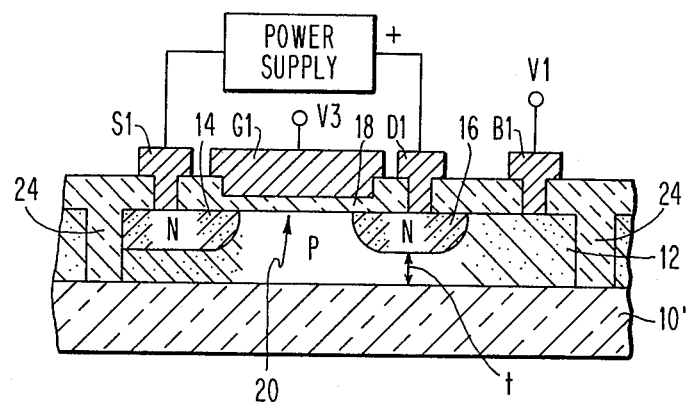
FIG. 5 is a cross sectional view of still another alternate embodiment of my invention.

Refer now to FIG. 5 for description of a still further embodiment of my invention. The FIG. 5 embodiment is a device with complete dielectric isolation and is best understood by considering it a modification of the FIG. 4A embodiment. As was the case in FIG. 4A, the ion implanted channel embodiment is equally applicable as is the illustrated gated embodiment. Reference numerals corresponding to those of FIG. 4A have been used insofar as has been practical. It is noted that the significant difference in FIG. 5 is the utilization of a dielectric substrate 10'. Such a dielectric substrate 10' is known to be made from a class of compounds such as sapphire, for example. This class of compounds permits the growth of monocrystalline epitaxial silicon to form region 12. The remainder of the structure then is identical to FIG. 4A except that recessed oxide 24 would only interface with dielectric substrate 10' and would not penetrate into it. It is noted that other techniques for forming devices with complete dielectric isolation are also known, for example, as described in Magdo et al. U.S. Pat. No. 3,944,447.

Figure 6:
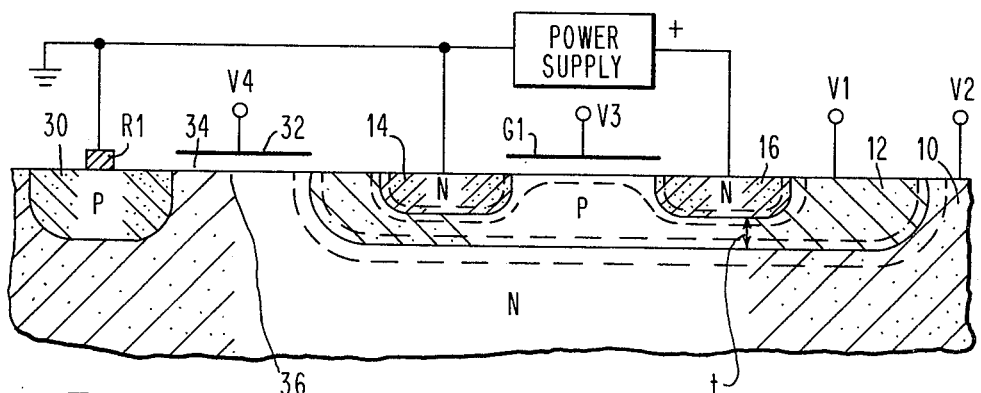
FIG. 6 is a schematic cross sectional view of a still further embodiment of my invention.

Refer now to FIG. 6 which schematically shows a still further embodiment of my invention. FIG. 6 again is shown as a modification of the 2A embodiment. What is illustrated is a threshold device having a faster response time by the addition of an FET resistor. The FET resistor is formed by an additional doped region 30 and an additional gate electrode 32 over an additional gate oxide 34. This forms an additional channel region 36 providing FET action between P regions 30 and 12. An electrode R1 makes contact to diffusion 30. Electrode R1 can be connected to an additional fixed potential or to the same reference potential as source region 14. The gate electrode 32 is connected to a fixed potential V4 which is maintained relatively negative, thereby biasing the P channel type FET resistor always "on". This provides a high resistance (approximately 100K ohms resistance) between the P regions 12 and 30.

The operation of my threshold device can be best understood by referring to FIGS. 6, 7, 8, and 9. The terms "threshold" or "cross-over" voltages (VC) are used interchangeably herein. An important feature of my invention is the ability to set the threshold voltage at any desired level in a very large range from a few volts to hundreds of volts. The value of threshold voltage is determined by the various doping levels and the previously described dimension t (or t'). This dimension previously defined as the distance between the drain diffusion and the substrate is actually the dimension of a pinch off region. The threshold voltage is also affected by the thickness of the gate oxide (in the embodiments where the gate is used) or the doping level of the channel implant (in the embodiments where no gate is used). Lastly, the various fixed voltages applied to the device determine, and can vary the threshold voltage even after complete fabrication.

Figure 7:
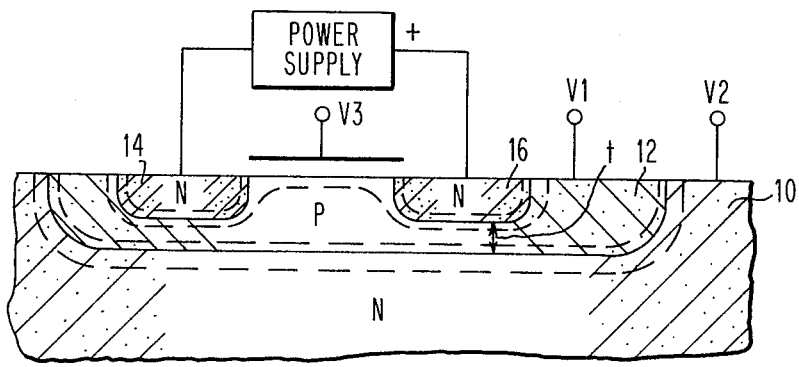
FIG. 7 is a schematic cross sectional view illustrating one aspect of the operation of my invention.

Consider first the FIG. 7 schematic in which a set of conditions keeping the threshold device in the "off" condition is described. Reference numerals corresponding to those of previous drawing figures are utilized. Actual oxide layers and electrodes have not been drawn in FIG. 7 in order to simplify the illustration of the mode of operation. The power supply provides a positive voltage to drain region 16 with respect to source region 14 and it is this positive voltage which is to be controlled in the case where it exceeds the threshold voltage of the herein device. The fixed potential applied to the source region 14 is the reference ground potential. For the purposes of this illustration, assume that the same reference potential (ground) is applied to the substrate 10 by letting the potential value at terminal V2 equal zero volts. Also, set the potential value at terminal V3 typically equal to 1-2 volts, at least sufficient to cause the gate electrode to attract minority carriers into the channel region potentially conditioning the drain to source path into the "on" condition. Also, apply a negative bias voltage in the order of −3 volts to region 12, via terminal V1. Assume initially that the power supply supplies zero volts at its plus terminal to drain region 16. Since V1 is the most negative voltage and is applied to P region 12, all the P-N junctions are reverse biased resulting in the illustrated space-charge regions. Space-charge regions are also referred to as depletion regions.

Figure 9:
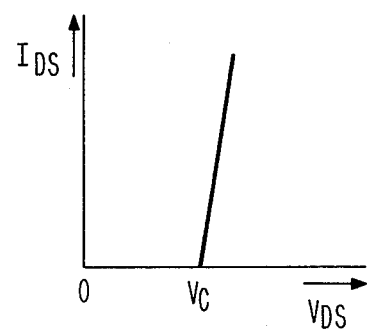
FIG. 9 is a waveform diagram illustrating the operation of my invention.

As illustrated in FIG. 7, as long as the positive voltage supplied by the power supply to drain region 16 is at low level, the depletion regions occasioned by the reverse biased P-N junctions between regions 12 and 16 and regions 12 and 10, do not meet because of the predesigned distance t (or t'). The potential V3, although potentially sufficiently high to cause surface inversion in the channel region does not do so in the FIG. 7 example due to the designed thickness of the gate insulator, the doping level of region 12 and the negative bias voltage V1. By increasing the voltage at terminal V2, to +10 volts, for example, this space-charge region along the P-N junction between regions 10 and 12 can be made thicker, but as illustrated in FIG. 7, does not traverse the distance t. Similarly, as the potential at the plus terminal of the power supply is increased, the drain region 16 is made more positive thickening the depletion layer at the P-N junction between regions 16 and 12. The potential at the drain region 16 can be increased and so long as the distance t is not traversed, the negative bias of region 12 will prevent the channel region from inverting and will prevent current flow between drain 16 and source 14. This condition which is illustrated in FIG. 7 will prevail so long as the voltage applied to the drain 16 relative to the source 14 is less than the threshold voltage (VC) of the device. This condition is illustrated in FIG. 9 where a drain to source voltage (VDS) that is less than VC will result in zero drain to source current (IDS).

Figure 8:
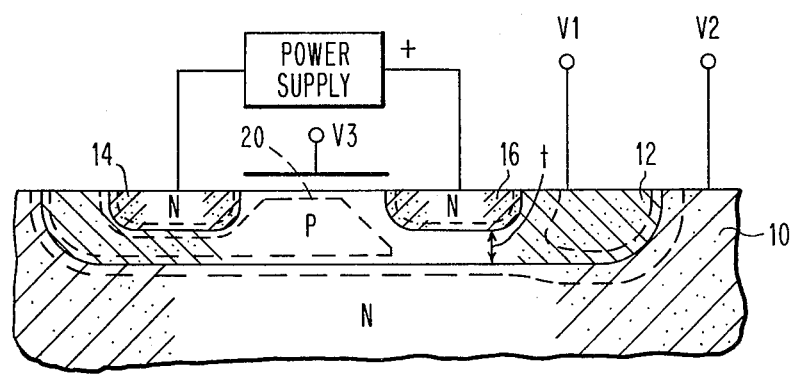
FIG. 8 is a schematic cross sectional view illustrating another aspect of the operation of my invention.

Refer now to FIG. 8 which illustrates the condition when the power supply potential has been increased to the point that the space-charge regions of the P-N junctions between regions 16 and 12 and regions 10 and 12 meet by traversing the distance t. This increased voltage at drain region 16 effectively "pinches off" the P region between drain 16 and substrate 10. For this reason, the negative bias at the terminal V1 is no longer applied to the portion of the P region 12 which is directly beneath the channel region 20. This portion of the P region 12 is then permitted to rise to approximately ground potential. If a ground reference potential is applied to substrate 10 at terminal V2 and ground potential being also applied to the source region 14, then the portion of the P region 12 directly beneath the channel region 20 also assumes ground potential. On the other hand, if substrate 10 receives a negative potential at terminal V2 with reference to the ground potential of source region 14, then the portion of P region 12 directly beneath the channel region 20 assumes a potential in the neighborhood of 0.1–0.4V corresponding to a weak forward bias of the P-N junction between the source region 14 and the adjacent portion of P region 12. As the potential of the portion of P region 12 beneath the channel region 20 rises, the gate voltage bias at the terminal V3 successfully causes inversion in the channel region permitting drain to source current (IDS) to flow from drain 16 to source 14. The threshold voltage (VC) at which drain to source current (IDS) commences is illustrated in FIG. 9. As the power supply potential increases further, increased current will flow in the channel region. Even though the power supply attempts to provide much higher positive voltages, the current flow from drain 16 to source 14 will increase dramatically to clamp the potential drop substantially to the threshold voltage VC. Since terminal V3 is held at a constant voltage, the gate to source bias remains constant. The drain terminal and source terminal of the threshold device are further connected to a utilization device (not shown). Thereby, the utilization device receives a voltage substantially clamped at potential VC. As the power supply's plus potential decreases, current flow decreases until the drain region 16 is brought to a potential below voltage VC. At this point in time, the space-charge regions across regions 16 and 12 and regions 12 and 10 will not meet; the pinch off of the distance t is thus eliminated, and the negative bias at the terminal V1 is applied to the P region beneath the channel region cutting off current flow from drain 16 to source 14.

Since the terminal V3 is maintained at a constant potential, to urge the channel region into inversion by attracting minority carriers, it becomes apparent that the implanting of minority carriers into the channel region produces the same result and eliminates the need for a fixed bias gate. Thus, in my embodiments in which the ion implant replaces the fixed bias gate, the devices are similarly held off by a negative bias supplied to region 12. Such ion implanted channel regions produce depletion mode field effect transistors which would normally be "on" but for the sufficiently high negative bias applied to the terminal V1. Thus, when the negative bias potential is blocked from the channel region by the previously described pinch off condition, the drain to source path is permitted to conduct current. Thus, my threshold device operates equally well with an ion implanted channel region and a fixed bias gate.

As previously mentioned, when pinch off occurs across distance t the portion of the P region 12 that is isolated from the negative bias terminal V1, charges to a near-ground potential level. Depending on the magnitudes of the dynamically varying capacitances and resistances, the "off" to "on" transition time constant can be on the order of 3–4 milliseconds. Although this is adequate for most industrial applications, it is possible that faster "off" to "on" transitions may be desired. One manner of achieving such a faster transition is through selective ion bombardment of the diode formed by source region 14 and the surrounding P type region. This can reduce the "off" to "on" transition to approximately 4–40 microseconds. Even faster transition times are possible by adding a resistor.

Such a resistor was previously shown in FIG. 6. Such a resistor effectively is a P channel field effect transistor formed between region 12 and an additional P region 30 and having a gate 32 with a fixed negative bias which always biases the P channel field effect transistor "on". The additional P region 30 can be connected to the same potential as the source region of the threshold device, which in the present example, is ground potential. When the threshold device is off, the current through the high resistance (approximately 100K ohm) resistor is not sufficient to effect the operation of the threshold device. However, when the threshold voltage to drain 16 is exceeded and pinch off occurs, then current from region 30 to the cut off portion of P region 12 can quickly permit inversion in the channel region between source 14 and drain 16. This permits "off" to "on" transition times in the order of five nanoseconds.

In integrated circuit form, it is envisioned that one threshold device would be present on an integrated circuit chip for each voltage to be stabilized. Thus, the addition of a high value resistance to speed up operation is not significant since only about two or three threshold devices would be required per integrated circuit chip. As will be obvious to those skilled in the art, the regulation of negative voltages can be achieved by my invention merely by altering the impurities in each of the regions to an opposite conductivity type and applying an opposite voltage polarity to each of the indicated terminals. It is also clear that in the case of a completely dielectric isolated device as illustrated in FIG. 5, the depletion layer would extend all the way from drain region 16 to the dielectric substrate 10'.

BEST MODE FOR CARRYING OUT THE INVENTION

The threshold device of my invention has wide applicability and can be fabricated in a large number of semiconductor processing technologies. For example, in the case of the FIG. 2A embodiment, the substrate 10 is a conventional N type silicon wafer or chip 10. A layer of thermal silicon dioxide in the order of 8000 Å is grown on its top surface. Through photolithography, a window is etched through the silicon dioxide layer to form the P type doped region 12. P type region 12 can be either diffused, or ion implanted and partially driven, in an inert (non-oxidizing) atmosphere. A thin layer in the order of 150 Å of thermal silicon dioxide is then grown over the P type region. Through the use of photoresist and photolithographic techniques, a masking pattern can be formed and N type impurities implanted through the thin oxide layer. In a subsequent processing step, P and N type impurities are driven in simultaneously while approximately 6000 Å of thermal oxide are grown. The processing is completed by conventional metallurgy and/or polysilicon techniques to form the structure illustrated in FIG. 2A.

Figure 10A:
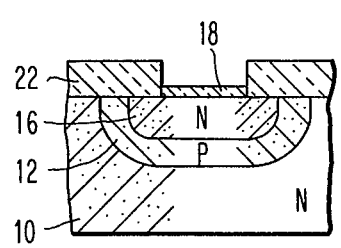
FIGS. 10A and 10B are cross sectional views of an intermediate structure in the fabrication of my invention.
Figure 10B:
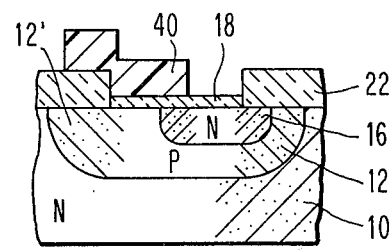

An intermediate structure in this process is shown in FIGS. 10A and 10B which illustrate cross sectional views perpendicular to each other. Photoresist 40 is shown in its appropriate position to partially mask gate oxide 18 in order to appropriately form ion implanted region 16. Note the enlarged portion 12' of region 12 in FIG. 10B which subsequently serves as a place for locating a contact electrode B1.

An alternate set of known processing steps can also be utilized to fabricate this structure of FIG. 2A. The process is identical through the step of growing the 150 Å thin layer of thermal oxide. At that point instead of depositing a coat of photoresist for the purpose of masking an ion implant step, a layer of silicon nitride is deposited. The nitride is then etched into a desired pattern through photolithographic processes so that nitride appears on the intermediate structure in FIG. 10B in lieu of the illustrated photoresist 40. At this point, the intermediate structure of FIGS. 10A and 10B is dip etched or reactive ion etched to remove the exposed portions of gate oxide 18. The N region 16 can then be formed by diffusion into the P region with subsequent drive in of both P and N type impurities during a simultaneous growth of 6000 Å thick thermal silicon dioxide. Although the foregoing are examples of known techniques by which my invention can be fabricated, other processing techniques will also suggest themselves to those skilled in the art.

While I have illustrated and described the preferred embodiments of my invention it is to be understood that I do not limit myself to the precise constructions herein disclosed and the right is reserved to all changes and modifications coming within the scope of the invention as defined in the appended claims.

Having thus described my invention, what I claim as new, and desire to secure by Letters Patent is:

1. A constant voltage threshold device for providing a substantially constant voltage across first and second terminals comprising:
    an isolated semiconductor region;
    a field effect device having source and drain regions formed in first and second parts, respectively, of said isolated semiconductor region, said isolated semiconductor region being doped with impurities of a first conductivity type, said source and drain regions being doped with impurities of a second conductivity type;
    a channel region formed between said source and drain regions in a third part of said isolated semiconductor region;
    said first terminal having a direct electrical connection to said source region and to one output of a power supply;
    said second terminal having a direct electrical connection to said drain region and to another output of said power supply;
    a third terminal, for applying a fixed biasing potential to a fourth part of said isolated semiconductor region;
    a pinch-off region formed in a fifth part of said isolated semiconductor region, adjacent to said drain region in a series electrical path between said channel region and said third terminal such that an increase in the amplitude of the output voltage of said power supply in excess of a predetermined potential level electrically isolates said channel region from said third terminal to permit current conduction across said first and second terminals through said channel region formed between said source and drain regions in said third part of said isolated semiconductor region.

2. A constant voltage threshold device as in claim 1 wherein said isolated semiconductor region doped with impurities of a first conductivity type and connected to said third terminal for applying a first fixed biasing potential is formed in a semiconductor substrate doped with impurities of a second conductivity type, further comprising;
    means for biasing said substrate to a second fixed potential.

3. A constant voltage threshold device as in claim 2 wherein said field effect device further comprises:
    a gate electrode overlying said channel region and dielectrically separated from said channel region; and
    means for applying a third fixed potential to said gate electrode.

4. A constant voltage threshold device as in claim 3 wherein said first conductivity type impurity is P while said second conductivity type impurity is N and the relative fixed potentials are such that said first fixed potential is negative with respect to said second fixed potential and said third fixed potential.

5. A constant voltage threshold device as in claim 2 wherein the drain region of said field effect device and said substrate are separated from each other by a predetermined distance through said isolated semiconductor region, the threshold voltage of said constant voltage threshold device being directly related to said distance.

6. A constant voltage threshold device as in claim 1 wherein said isolated semiconductor region is laterally surrounded by oxide material formed by oxidation of portions of semiconductor material forming said isolated semiconductor region.

7. A constant voltage threshold device as in claim 1 wherein said isolated semiconductor region is supported on a dielectric substrate.

8. A constant voltage threshold device as in claim 1 further comprising:
the channel region between said source and drain regions is formed by doping surface portions of said isolated semiconductor region extending between said source and drain regions with impurities of the same conductivity type as said source and drain regions.

9. A constant voltage threshold device as in claim 1 wherein said isolated semiconductor region is a first isolated semiconductor region, and further comprising:
another isolated semiconductor region spaced from said first isolated semiconductor region; and
a channel region located between said first and another isolated semiconductor regions, thereby forming a resistor connected to said first isolated semiconductor region.

* * * * *